(12) United States Patent
Seo et al.

(10) Patent No.: US 7,511,328 B2
(45) Date of Patent: Mar. 31, 2009

(54) SEMICONDUCTOR DEVICE HAVING RAISED CELL LANDING PAD AND METHOD OF FABRICATING THE SAME

(75) Inventors: Jung-Woo Seo, Suwon-si (KR); Tae-Hyuk Ahn, Yongin-si (KR); Jong-Seo Hong, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 155 days.

(21) Appl. No.: 11/268,551

(22) Filed: Nov. 8, 2005

(65) Prior Publication Data

US 2006/0138561 A1    Jun. 29, 2006

(30) Foreign Application Priority Data

Dec. 27, 2004    (KR) .................. 10-2004-0113178

(51) Int. Cl.
*H01L 27/108* (2006.01)
(52) U.S. Cl. .................. 257/311; 257/296; 257/300; 257/304; 257/E21.648
(58) Field of Classification Search .................. 257/211, 257/304, 311, 296, 300, E21.648
See application file for complete search history.

(56) References Cited

U.S. PATENT DOCUMENTS 6,483,143 B2 * 11/2002 Matsui et al. ................ 257/311
6,727,139 B2   4/2004 Roberts et al.
6,902,998 B2 *  6/2005 Lee et al. ..................... 438/616
7,002,199 B2 *  2/2006 Fukuzumi .................... 257/296
7,049,203 B2 *  5/2006 Chung et al. ................ 438/396
2002/0113237 A1 * 8/2002 Kitamura ..................... 257/71

FOREIGN PATENT DOCUMENTS

| JP | 05-063093 | 3/1993 |
| KR | 1998-085833 | 12/1998 |
| KR | 2003-0002749 | 1/2003 |

* cited by examiner

*Primary Examiner*—Jerome Jackson, Jr.
*Assistant Examiner*—Jose R Diaz
(74) *Attorney, Agent, or Firm*—Harness, Dickey & Pierce

(57) ABSTRACT

A semiconductor device and method of manufacturing the same having pad extending parts, the semiconductor device includes an isolation layer that defines an active region and a gate electrode which traverses the active region. A source region is provided in the active region at one side of the gate electrode, and a drain region is provided in the active region at a second side of the gate electrode. A first interlayer insulating layer covers the semiconductor substrate. A source landing pad is electrically connected to the source region, and a drain landing pad is electrically connected to the drain region. A pad extending part is laminated on one or more of the source landing pad and the drain landing pad. The pad extending part has an upper surface located in a plane above a plane corresponding to the upper surfaces of the source landing pad and the drain landing pad.

9 Claims, 9 Drawing Sheets

SEMICONDUCTOR DEVICE HAVING RAISED CELL LANDING PAD AND METHOD OF FABRICATING THE SAME

BACKGROUND OF THE INVENTION

This application claims priority to Korean Patent Application No. 2004-113178, filed Dec. 27, 2004, in the Korean Intellectual Property Office, the entire contents of which are incorporated herein by reference.

1. Field of the Invention

The present invention relates to a semiconductor device and a method of fabricating the same, and more particularly, to a semiconductor device having a raised cell landing pad and a method of fabricating the same.

2. Description of the Related Art

A semiconductor device, such as a dynamic random access memory (DRAM), a static random access memory (SRAM), or a nonvolatile memory (NVM), may include a plurality of transistors. As a result of increased integration density of the semiconductor device, a gate electrode and source and drain regions which are components of the transistor have been miniaturized. For example, in case of the DRAM, a method of connecting a cell capacitor with a cell transistor to form a unit cell is widely employed. In order to increase integration efficiency, the cell transistor may be formed on a semiconductor substrate, an interlayer insulating layer may be formed thereon, and a cell capacitor may be formed on the interlayer insulating layer. The source region of the cell transistor may be connected to a lower electrode of the cell capacitor, the drain region of the cell transistor may be connected to a bit line, and the gate electrode of the cell transistor may be connected to a word line. As a cell transistor is miniaturized, it is very difficult to arrange interconnecting wirings.

FIG. 1 is a partial cross-sectional view of a conventional transistor including a landing pad. Referring to FIG. 1, the conventional transistor may include an isolation layer 13 which may be formed in a semiconductor substrate 11 and define an active region 15. Gate electrodes 17 may traverse the active region 15. As shown in FIG. 1, gate dielectric layers 16 may be interposed between the gate electrodes 17 and the active region 15. Hard mask patterns 18 may be laminated on the gate electrodes 17. Insulating spacers 19 may be formed on the sidewalls of the gate electrodes 17 and the hard mask patterns 18. Source and drain regions 23 may be formed in the active region 15 at both sides of the gate electrodes 17. Low concentration impurity regions 25 may reside in the active region 15 below insulating spacers 19. A first interlayer insulating layer 21 which covers the entire surface of the semiconductor substrate 11 having the gate electrodes 17 may be provided. Landing pads 27 which pass through the first interlayer insulating layer 21 and are electrically connected to the source and drain regions 23 may be provided. A second interlayer insulating layer 31 may be laminated on the first interlayer insulating layer 21 having the landing pads 27. A bit line 35 may be arranged on the second interlayer insulating layer 31 and electrically connected to any one of the source and drain regions 23 through a contact plug passing through the second interlayer insulating layer 31. A third interlayer insulating layer 41 covering the bit line 35 and the second interlayer insulating layer 31 may be laminated. Source contact plugs 45 which pass through the third interlayer insulating layer 41 and the second interlayer insulating layer 31 and are electrically connected to the landing pads 27 may be provided.

The upper surfaces of the landing pads 27 and the first interlayer insulating layer 21 may be arranged on a substantially same plane. Accordingly, it is difficult to ensure appropriate arrangement spacing around the source contact plugs 45. As shown in FIG. 1, although only a slight alignment error M is generated when forming the source contact plugs 45, the source contact plug may contact with the adjacent landing pad 27.

SUMMARY OF THE INVENTION

Example embodiments of the present invention may provide a semiconductor device having a raised cell landing pad in which adequate spacing is provided to compensate for an alignment margin of a contact plug forming process.

Example embodiments of the present invention may also provide a dynamic random access memory (DRAM) device having a raised cell landing pad in which adequate spacing is provided to compensate for an alignment margin of a contact plug forming process.

Example embodiments of the present invention may also provide a method of fabricating a semiconductor device having a raised cell landing pad.

An example embodiment of a semiconductor device according to the present invention may include an isolation layer, which is provided in an area of a semiconductor substrate and defines an active region, and a gate electrode which traverses the active region. In the example embodiment of the present invention, a source region may be provided in the active region at one side of the gate electrode and a drain region may be provided in the active region at a second side of the gate electrode. Further, a first interlayer insulating layer which covers the semiconductor substrate having the gate electrode may be included. The example embodiment of the present invention may also include a source landing pad, which passes through the first interlayer insulating layer, that is electrically connected to and provided on the source region, as well as a drain landing pad, which passes through the first interlayer insulating layer, that is electrically connected to and provided on the drain region. Still further, the example embodiment of the present invention may include a pad extending part laminated on at least one of the source landing pad and the drain landing pad. The pad extending part has an upper surface which is located in a plane above a plane corresponding to the upper surfaces of the source landing pad and the drain landing pad.

In an example embodiment of a semiconductor device of the present invention, the pad extending part may be laminated on the source landing pad. Further, the pad extending part may be misaligned with the source landing pad and overlap with an upper surface of the source landing pad by at least half of a maximum contact area of the source landing pad, wherein a distance between the pad extending part and the drain landing pad is greater than a distance between the source landing pad and the drain landing pad.

In an example embodiment of a semiconductor device of the present invention, the pad extending part may be laminated on the drain landing pad. The example embodiment of the present invention may include a second interlayer insulating layer covering the first interlayer insulating layer and exposing the upper surface of the pad extending part, a bit line which is arranged on the second interlayer insulating layer and contacts the pad extending part, a third interlayer insulating layer covering the bit line and the second interlayer insulating layer, and a storage node contact plug which passes through the third interlayer insulating layer and the second interlayer insulating layer and contacts with the source landing pad. The storage node contact plug may be misaligned with the source landing pad to be apart from the drain landing pad.

In an example embodiment of a semiconductor device of the present invention, the storage node contact plug may be misaligned with the source landing pad and overlap with the upper surface of the source landing pad by at least a half of a maximum contact area such that a distance between the storage node contact plug and the drain landing pad is greater than a distance between the source landing pad and the drain landing pad.

An example embodiment of a DRAM of the present invention may include an isolation layer which is provided in an area of a semiconductor substrate and defines an active region and a gate electrode which traverses the active region. In the example embodiment of the present invention, a source region may be provided in the active region at one side of the gate electrode and a drain region may be provided in the active region at a second side of the gate electrode. Further, a first interlayer insulating layer which covers the semiconductor substrate having the gate electrode may be provided. The example embodiment of the DRAM of the present invention may also include a source landing pad, which passes through the first interlayer insulating layer, that is electrically connected to and provided on the source region, as well as a drain landing pad, which passes through the first interlayer insulating layer, that is electrically connected to and provided on the drain region. Still further, the example embodiment of the present invention may include a pad extending part laminated on at least one of the source landing pad and the drain landing pad. The pad extending part has an upper surface which is located in a plane above a plane corresponding to upper the surfaces of the source landing pad and the drain landing pad. The example embodiment of the present invention may also include a bit line which is arranged on the drain landing pad and electrically connected to the drain landing pad. The example embodiment of the present invention may include a cell capacitor provided on the source landing pad, wherein the lower electrode of the cell capacitor is electrically connected to the source landing pad.

In an example embodiment of a DRAM of the present invention, the pad extending part may be laminated on the source landing pad. Further, the pad extending part may be misaligned with the source landing pad and overlap with an upper surface of the source landing pad by at least half of a maximum contact area of the source landing pad, wherein a distance between the pad extending part and the drain landing pad is greater than a distance between the source landing pad and the drain landing pad.

In an example embodiment of a DRAM of the present invention, the pad extending part may be laminated on the drain landing pad. The example embodiment of the present invention may include: a second interlayer insulating layer which covers the first interlayer insulating layer; is provided below the bit line, and surrounds the sidewall of the pad extending part; a third interlayer insulating layer covering the bit line and the second interlayer insulating layer and provided below the cell capacitor; and a storage node contact plug which passes through the third interlayer insulating layer and the second interlayer insulating layer between the lower electrode and the source landing pad and electrically connects the lower electrode with the source landing pad. The storage node contact plug may be misaligned with the source landing pad to be apart from the drain landing pad.

In an example embodiment of a DRAM of the present invention, the storage node contact plug may be misaligned with the source landing pad and overlap with the upper surface of the source landing pad by at least half of a maximum contact area of the source landing pad such that a distance between the storage nod contact plug and the drain landing pad is greater than a distance between the source landing pad and the drain landing pad.

An example embodiment of present invention provides a method of fabricating a semiconductor device. The example embodiment of the method may include the following: forming an isolation layer defining an active region in an area of a semiconductor substrate; forming a gate electrode traversing the active region; injecting impurity ions into the active region to form a source region at one side of the gate electrode and form a drain region at a second side of the gate electrode; forming a first interlayer insulating layer which covers the semiconductor substrate having the gate electrode; forming a source landing pad which passes through the first interlayer insulating layer and is electrically connected to the source region; forming a drain landing pad which passes through the first interlayer insulating layer and is electrically connected to the drain region; forming a pad extending conductive layer which contacts with the source landing pad and the drain landing pad and covers the first interlayer insulating layer; and patterning the pad extending conductive layer to form a pad extending part on at least one of the source landing pad and the drain landing pad, wherein the pad extending part has an upper surface which is located above upper surfaces of the source landing pad and the drain landing pad.

An example embodiment of the present invention provides a method of fabricating a semiconductor device including the steps of forming an isolation layer defining an active region in an area of a semiconductor substrate; forming a gate electrode on the active region; forming a source region on one side of the gate electrode; forming a drain region on another side of the gate electrode; forming a first interlayer insulating layer covering the semiconductor substrate having the gate electrode; forming a source landing pad arranged on the source region; forming a drain landing pad arranged on the drain region; forming a pad extending part on at least one of the source landing pad and the drain landing pad; forming a bit line electrically connected to the drain landing pad; and forming a storage node contact plug electrically connected to the source landing pad.

BRIEF DESCRIPTION OF THE DRAWINGS

Example embodiments of the present invention will become more apparent and more readily appreciated from the following description of example embodiments of the present invention taken in connection with the accompanying figures.

DETAILED DESCRIPTION OF EXAMPLE EMBODIMENTS OF THE INVENTION

Figure 1:
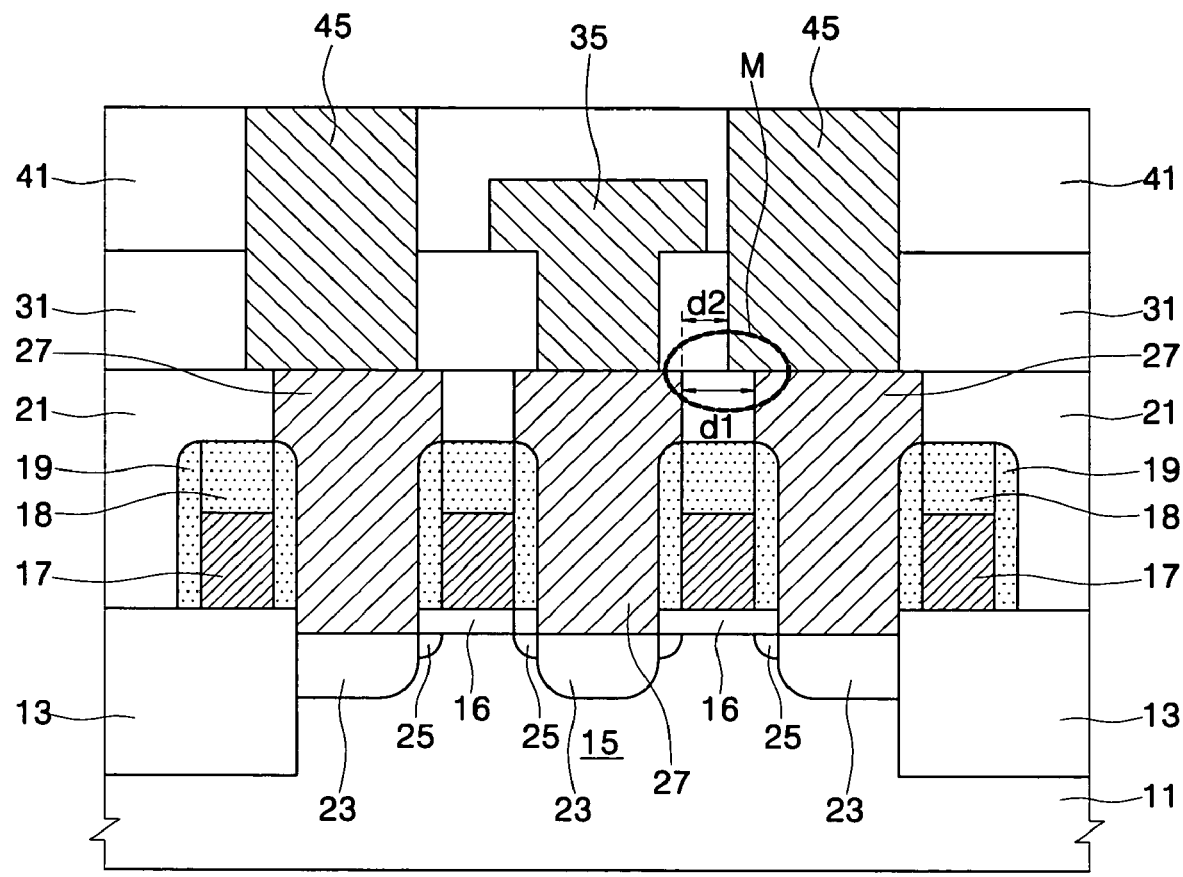
FIG. 1 is a partial cross-sectional view of a conventional transistor including a landing pad.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein. Further, as set forth, example embodiments of the present invention include various features being combinable in all possible permutations, and not limited to the numerous, example combinations set forth below.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Example embodiments of the present invention are described in detail with reference to the attached figures. However, the example embodiments of the present invention are illustrative and not intended to be limiting. In the example embodiments of the present invention illustrated in the figures, the thicknesses of layers and/or regions are not necessarily to scale and may be exaggerated for clarity. In the figures, if a layer is formed on another layer or a substrate, it may mean that the layer is directly formed on another layer and/or a substrate, or that a third layer is interposed therebetween. In the following description of the example embodiments of the present invention, the same reference numerals denote the same elements.

Figure 2:
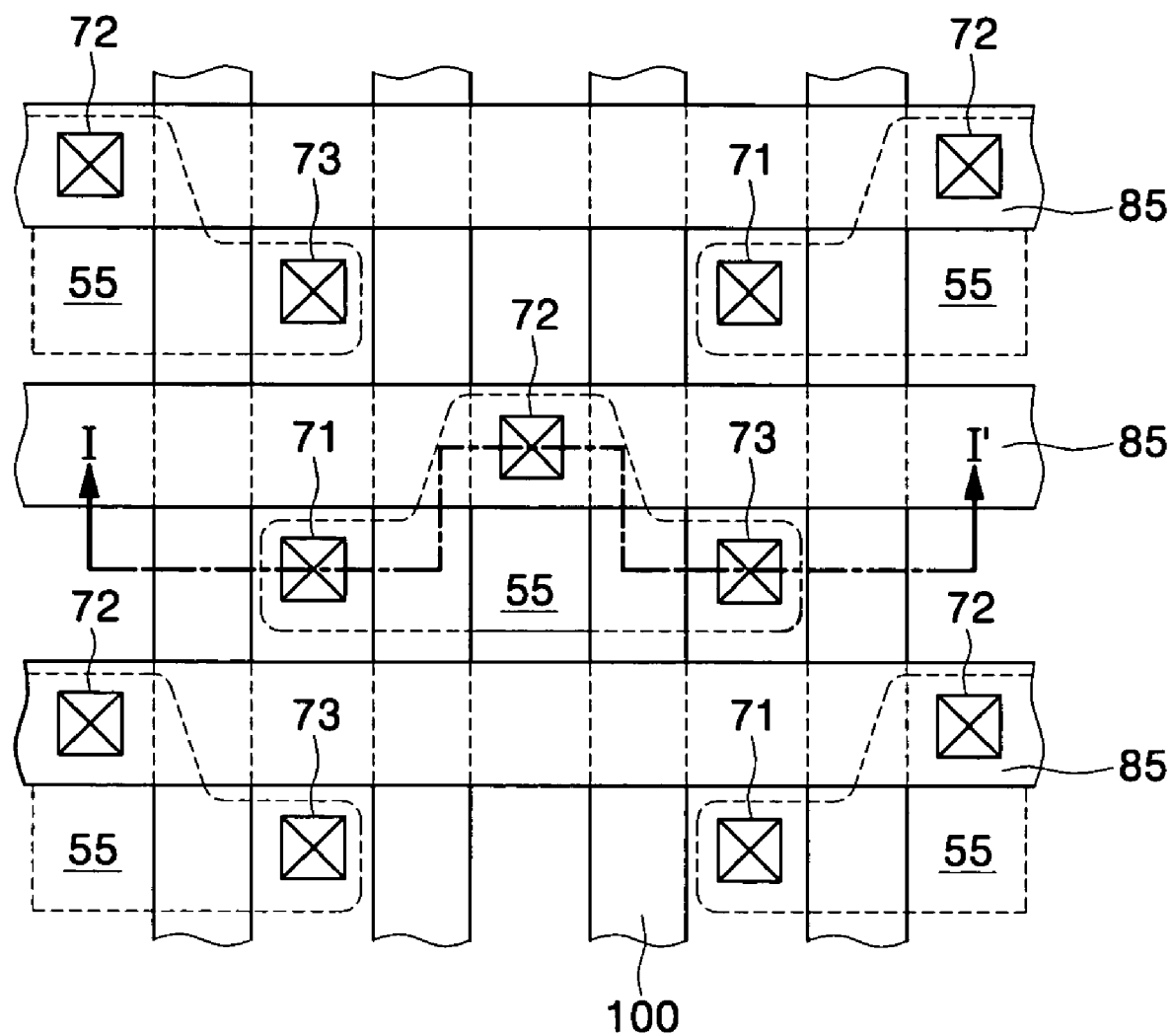
FIG. 2 is a plan view showing a portion of an example embodiment of a dynamic random access memory (DRAM) device of the present invention.
Figure 3:
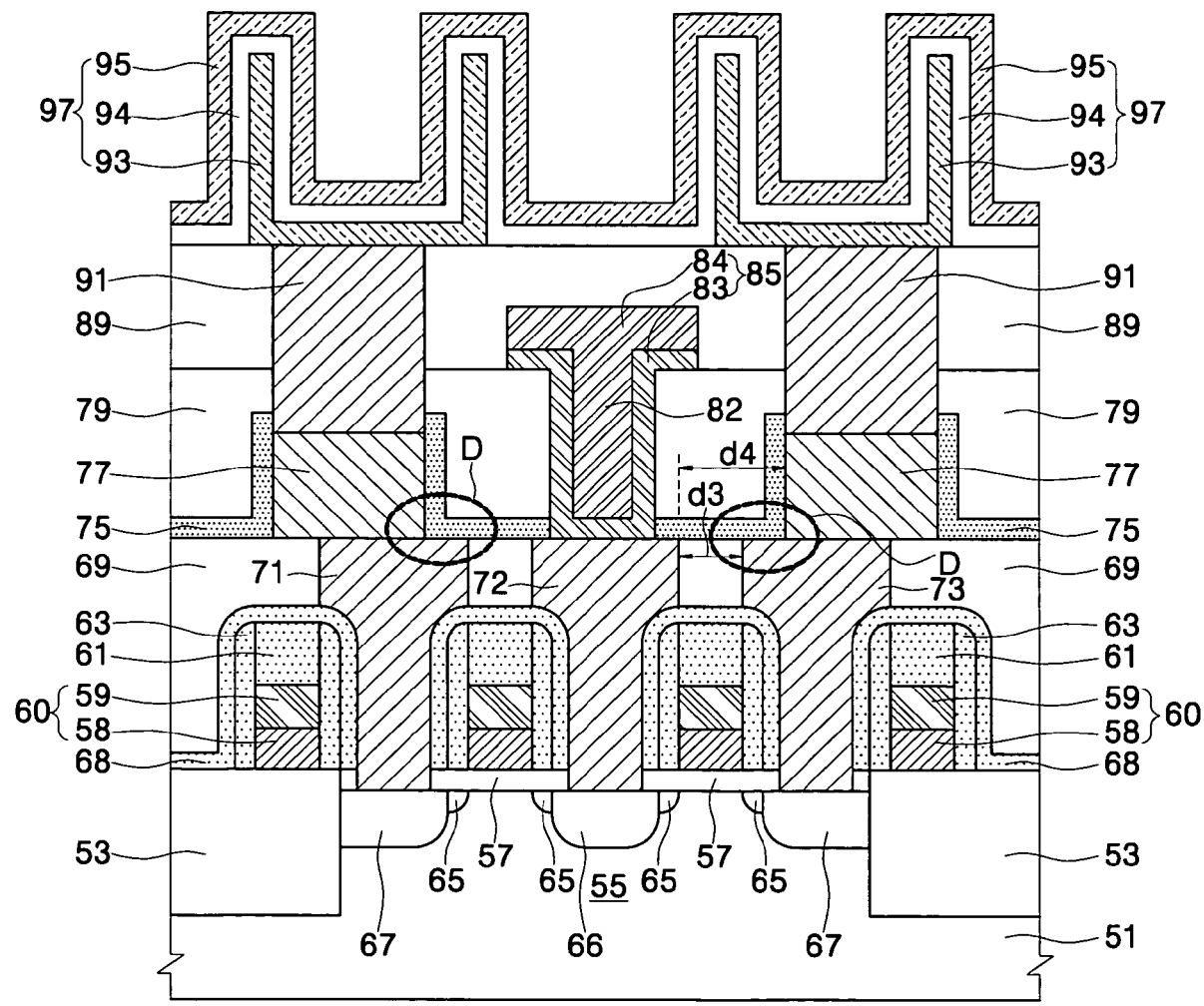
FIG. 3 is a cross-sectional view taken along a line I-I' of FIG. 2 for illustrating an example embodiment of a DRAM device of the present invention.
Figure 10:
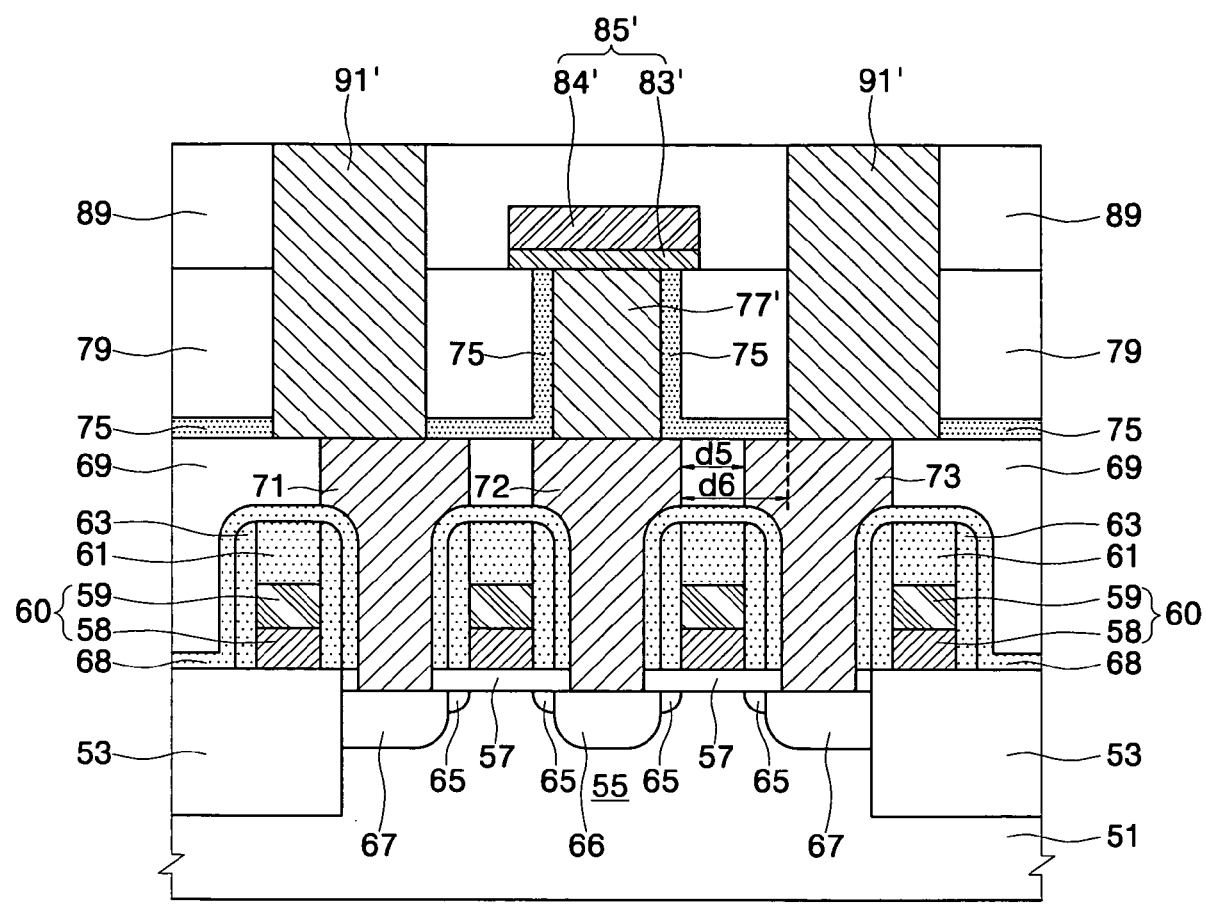
FIG. 10 is a cross-sectional view taken along the line I-I' of FIG. 2 for illustrating an example embodiment of a method of fabricating another example embodiment of a DRAM device of the present invention.

FIG. 2 is a plan view of an example embodiment of the present invention illustrating a portion of a dynamic random access memory (DRAM) device having a raised cell landing pad according to an example embodiment of the present invention; FIG. 3 is a cross-sectional view taken along a line I-I' of FIG. 2 illustrating an example embodiment of a DRAM device according to an example embodiment of the present invention; and FIG. 10 is a cross-sectional view taken along the line I-I' of FIG. 2 illustrating a method of fabricating another DRAM device according to an example embodiment of the present invention.

Referring to FIGS. 2 and 3, in an example embodiment of the present invention, an isolation layer 53 may be formed in a region of a semiconductor substrate 51. The isolation layer 53 may define active regions 55. The isolation layer 53 may be an insulating layer filling a trench region formed in the semiconductor substrate 51. Word lines 100 may be formed on the active regions 55 to traverse the active regions 55. The word lines 100 may be arranged substantially parallel with each other as shown in the plan view of FIG. 2. Cell transistors may be provided at intersections between the word lines 100 and the active regions 55. In an example embodiment of the present invention, as shown in FIG. 3, the word lines 100 traversing the active regions 55 may serve as gate electrodes 60. The gate electrode 60 may be insulated from the active region 55 by a gate dielectric layer 57. Also, the gate electrode 60 may include a lower gate conductive pattern 58 and an upper gate conductive pattern 59 laminated in sequence. A hard mask pattern 61 may be laminated on the gate electrode 60. An insulating spacer 63 may be formed on the sidewalls of the hard mask pattern 61 and/or the gate electrode 60.

As shown in FIGS. 2 and 3, an example embodiment of a method of arranging two cell transistors on one active region 55 may be used. That is, two gate electrodes 60 may be arranged on the active region 55. The word lines 100 may be arranged on the isolation layer 53. An example embodiment of a cell transistor may include a drain region 66 provided at one side of the gate electrode 60 and a source region 67 provided at another side of the gate electrode 60. The drain region 66 may be provided in the active region 55 between the gate electrodes 60, and the source region 67 may be provided in the active region 55 opposite to the drain region 66 beside the gate electrodes 60. An example embodiment of the present invention may also include low concentration impurity regions 65 provided in the active region 55 below insulating spacers 63.

In an example embodiment of the present invention, a first interlayer insulating layer 59 may be arranged on the semiconductor substrate 51 having the gate electrodes 60. A first interlayer insulating layer 69 may be laminated on the semiconductor substrate 51 having the gate electrodes 60. A first etch stopping layer 68 may be interposed between the gate electrodes 60 and the first interlayer insulating layer 69. The first interlayer insulating layer 69 may be a planarized insulating layer. Source landing pads 71 and 73, which may pass through the first interlayer insulating layer 69, may be electrically connected to and/or arranged on the source regions 67. A drain landing pad 72, which may pass through the first interlayer insulating layer 69, may be electrically connected to and/or arranged on the drain region 66. The upper surfaces of the first interlayer insulating layer 69, the source landing pads 71 and 73, and the drain landing pad 72 may be arranged on a substantially same plane.

A pad extending part 77 may be arranged on and/or laminated on at least one of the source landing pads 71 and 73 and the drain landing pad 72. The pad extending part 77 has an upper surface which is more raised than the upper surface of one or more of the source landing pads 71 and 73 and the drain landing pad 72.

Referring to FIG. 3, an example embodiment in which the pad extending parts 77 may be laminated on the source landing pads 71 and 73 will be described. The pad extending parts 77 may be laminated on the source landing pads 71 and 73. As shown in an example embodiment of FIG. 3, the pad extending parts 77 may form a structure D, wherein the pad extending parts 77 are misaligned with the source landing pads 71 and 73, such that the distance between the pad extending parts 77 and the drain landing pad 72 is greater than the distance between the source landing pads 71 and 73 and the drain landing pad 72 (e.g. d4>d3). According to an example embodiment of the present invention, if the pad extending parts 77 have the structure D and/or are misaligned with the source landing pads 71 and 73, the pad extending parts 77 should overlap with the upper surfaces of the source landing pads 71 and 73. According to an example embodiment of the present invention, the overlap between the pad extending parts 77 and source landing pads 71 and 73 should be at least half of the maximum contact area of the source landing pads 71 and 73.

A second interlayer insulating layer 79 may be arranged on and/or laminated on the semiconductor substrate 51 having the pad extending parts 77. A bit line 85 may be provided on the second interlayer insulating layer 79. The bit line 85 may include a barrier metal layer 83 and a bit line metal layer 84 laminated in sequence. The bit line 85 may be electrically connected to the drain landing pad 72 by a bit line contact plug 82 passing through the second interlayer insulating layer 79. In an example embodiment of the present invention, as shown in FIG. 3, the bit line 85 is electrically connected to the drain region 66 through the bit line contact plug 82 and the drain landing pad 72. A second etch stopping layer 75 may be provided below the second interlayer insulating layer 79. The second etch stopping layer 75 may be arranged to cover the sidewalls of the pad extending parts 77 and the first interlayer insulating layer 69. Alternatively, the second etch stopping layer 75 may be interposed only between the sidewalls of the pad extending parts 77 and the second interlayer insulating layer 79.

According to an example embodiment of the present invention, a third interlayer insulating layer 89 covering the bit line 85 and the second interlayer insulating layer 79 may be laminated. Cell capacitors 97 may be provided on the third interlayer insulating layer 89. The cell capacitors 97 may include one or more lower electrodes 93 and one or more upper electrodes 95. A capacitor dielectric layer 94 may be interposed between the lower electrodes 93 and the one or more upper electrodes 95. Storage node contact plugs 91 may be arranged between the lower electrodes 93 and the pad extending parts 77. The storage node contact plugs 91 may pass through the third interlayer insulating layer 89 and the second interlayer insulating layer 79. According to an example embodiment of the present invention, the lower electrodes 93 of the cell capacitors 97 may electrically connect to the source regions 67 through the storage node contact plugs 91, the pad extending parts 77, and the source landing pads 71 and 73.

As mentioned above with respect to the example embodiment illustrated in FIG. 3, the pad extending parts 77 may have upper surfaces which are located in a plane above the plane of the upper surface of the drain landing pad 72. The storage node contact plugs 91 may be arranged on the pad extending parts 77. Further, the pad extending parts 77 may have the structure D, wherein the pad extension parts 77 are misaligned with the source landing pads 71 and 73 such that the distance between pad extending parts 77 and the drain landing pad 72 is greater than the distance between the source landing pads 71 and 73 and the drain landing pad 72 (e.g., d4>d3). Accordingly, the alignment margin of the storage node contact plugs 91 may be remarkably increased, compared with the prior art.

Now, an example embodiment of the present invention in which a pad extending part 77' may be arranged on and/or laminated on the drain landing pad 72 will be described.

Referring to FIGS. 2, 3, and 10, a pad extending part 77' may be arranged on and/or laminated on a drain landing pad 72. The second interlayer insulating layer 79 may be arranged on and/or laminated on the semiconductor substrate 51 having the pad extending part 77'. A bit line 85' may be provided on a second interlayer insulating layer 79. The bit line 85' may include a barrier metal layer 83' and a bit line metal layer 84' laminated in sequence. The bit line 85' may be electrically connected to the drain landing pad 72 by the pad extending part 77' which may pass through the second interlayer insulating layer 79. Accordingly, the bit line 85' may electrically connect to the drain region 66 through the pad extending part 77' and the drain landing pad 72. Further, a second etch stopping layer 75 may be provided below the second interlayer insulating layer 79. The second etch stopping layer 75 may cover the sidewalls of the pad extending part 77' and/or the first interlayer insulating layer 69. Alternatively, the second etch stopping layer 75 may be interposed between the sidewalls of the pad extending part 77' and the second interlayer insulating layer 79. A third interlayer insulating layer 89 that may cover the bit line 85' and/or the second interlayer insulating layer 79 may be laminated. Cell capacitors 97, as shown in FIG. 3, may be provided on the third interlayer insulating layer 89. Storage node contact plugs 91' may be arranged between the lower electrodes 93 and the source landing pads 71 and 73. The storage node contact plugs 91' may pass through the third interlayer insulating layer 89 and the second interlayer insulating layer 79. The lower electrode 93 of the cell capacitors 97 may electrically connect to the source regions 67 through the storage node contact plugs 91' and the source landing pads 71 and 73. The storage node contact plugs 91' may be misaligned with the source landing pads 71 and 73 to be apart from the drain landing pad 72 such that the distance between the contact plugs 91' and the drain landing pad 72 is greater than the distance between the source landing pads 71 and 73 and the drain landing pad 72 (e.g., d6>d5). According to an example embodiment of the present invention, if the storage node contact plugs 91' are misaligned with the source landing pads 71 and 73, the storage node contact plugs 91' overlap with the upper surfaces of the source landing pads 71 and 73. As shown in the example embodiment of FIG. 10, the contacts plugs 91' overlap with the upper surface of the source landing pads 71 and 73 by at least half of the maximum contact area of the upper surfaces of the source landing pads 71 and 73.

FIGS. 4 to 8 are cross-sectional views taken along the line I-I' of FIG. 2 and illustrate a method of fabricating the DRAM device according to an example embodiment of the present invention.

Figure 4:
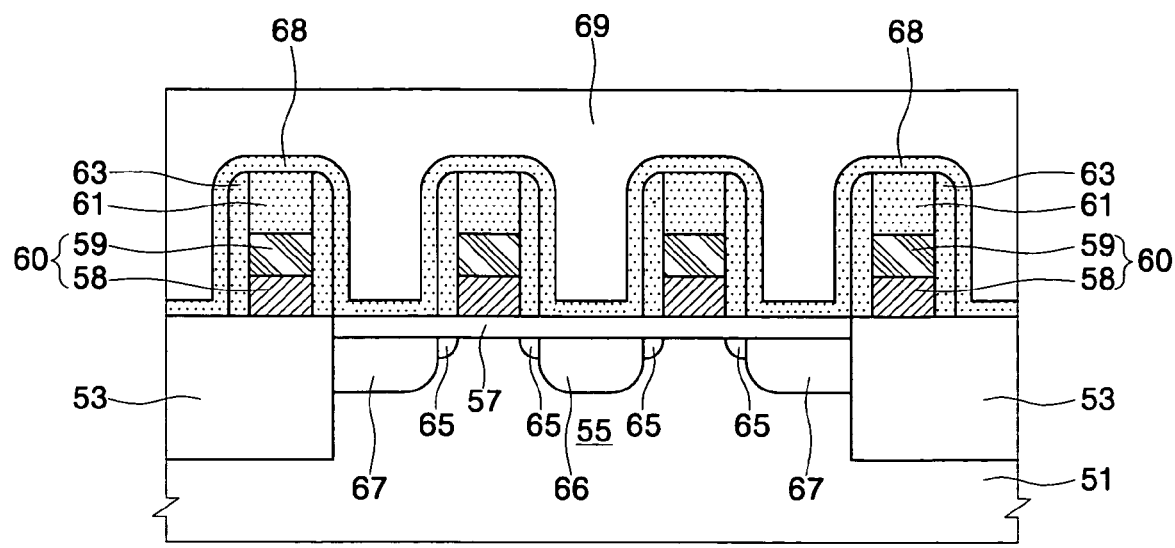
FIGS. 4 to 8 are cross-sectional views taken along the line I-I' of FIG. 2 for illustrating an example embodiment of a method of fabricating a DRAM device according to an example embodiment of the present invention.

Referring to FIGS. 2 and 4, the isolation layer 53 may be formed in a region of the semiconductor substrate 51. The isolation layer 53 may define the active regions 55. The isolation layer 53 may be formed of an insulating layer for filling the trench region formed in the semiconductor substrate 51, for example, a high density plasma (HDP) oxide layer. The word lines 100 may be formed to traverse the active regions 55. The gate dielectric layer 57, the lower gate conductive layer, the upper gate conductive layer, and the hard mask layer may be laminated on the semiconductor substrate 51 having the isolation layer 53 in sequence and may be formed of various materials. For example, the gate dielectric layer 57 may be a silicon oxide layer using thermal oxidation; the lower gate conductive layer may be formed of a polysilicon layer; the upper gate conductive layer may be formed of a tungsten silicide (WSi) layer; and the hard mask layer may be formed of a silicon nitride (SiN) layer or a silicon oxynitride (SiON) layer. The hard mask layer, the upper gate conductive layer, and the lower gate conductive layer may be successively patterned to form the hard mask pattern 61, the upper gate conductive pattern 59, and the lower gate conductive pattern 58. Further, the lower gate conductive pattern 58 and the upper gate conductive pattern 59 laminated in sequence may serve as the gate electrode 60. Also, the gate electrode 60 may be extended to form the word line 100.

As shown in FIGS. 2 and 4, a method of arranging two cell transistors on one active region 55 may be used. In an example embodiment of the present invention, two gate electrodes 60 may be formed on the active region 55. The word lines 100 may be arranged substantially parallel with each other. The word lines 100 may be arranged on the isolation layer 53. Low concentration impurity regions 65 may be formed by injecting impurity ions into the active region 55 using the hard mask patterns 61 and the gate electrodes 60 as an ion injecting mask. Subsequently, a conformal spacer insulating layer may be formed on the entire surface of the semiconductor substrate 51. The spacer insulating layer may be formed of a silicon nitride (SiN) layer using chemical vapor deposition. The spacer insulating layer may be anisotropically etched to form insulating spacers 63 covering the sidewalls of the hard mask pattern 61 and the gate electrode 60. The source regions 67 and/or the drain region 66 may be formed by injecting impurity ions into the active region 55 using the hard mask patterns 61 and the insulating spacers 63 as an ion injecting mask. In an example embodiment of the present invention, the drain region 66 may be provided in the active region 55 between gate electrodes 60, and the source regions 67 may be provided in the active region 55 opposite to the drain region 66 beside the gate electrode 60. The low concentration impurity region 65 may reside in the active region 55 below insulating spacers 63.

A first etch stopping layer 68 may be formed on the semiconductor substrate 51 having the gate electrodes 60. The first etch stopping layer 68 may be formed of a silicon nitride (SiN) layer using chemical vapor deposition. The first interlayer insulating layer 69 may be arranged on and/or laminated on the semiconductor substrate 51 having the first etch stopping layer 68. The first interlayer insulating layer 69 may be formed of, for example, an insulating layer such as a BPSG layer. The upper surface of the first interlayer insulating layer 69 may be planarized.

Figure 5:
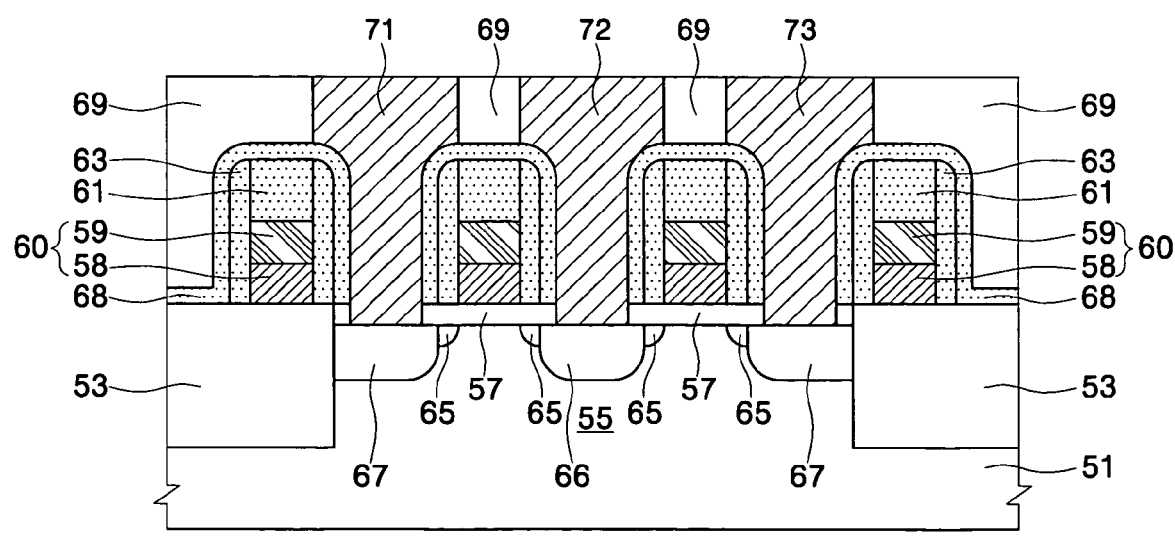

Referring to FIGS. 2 and 5, the first interlayer insulating layer 69 and the first etch stopping layer 68 may be patterned to form landing pad contact holes exposing source regions 67 and/or drain region 68. A landing pad conductive layer may completely fill the landing pad contact holes and/or cover the first interlayer insulating layer 69. The landing pad conductive layer may be formed of a polysilicon layer and/or a metal layer. According to an example embodiment of the present invention, if the landing pad conductive layer is formed of the metal layer, it may be formed of a tungsten layer. The landing pad conductive layer may be planarized to form source landing pads 71 and 73 and/or drain landing pad 72. A process of planarizing the landing pad conductive layer may use a chemical and/or mechanical polishing method using the first interlayer insulating layer 69 as a stopping layer. Accordingly, the source land pads 71 and 73 which may pass through the first interlayer insulating 69 and electrically connect to the source regions 67 may be formed on the source regions 67. Further, the drain landing pad 72 which may pass through the first interlayer insulating layer 69 and electrically connect to the drain region 66 may be formed on the drain region 66. According to an example embodiment of the present invention, as shown in FIG. 5, the upper surfaces of the first interlayer insulating layer 69, the source landing pads 71 and 73, and the drain landing pad 72 may be exposed in a substantially same plane.

Figure 6:
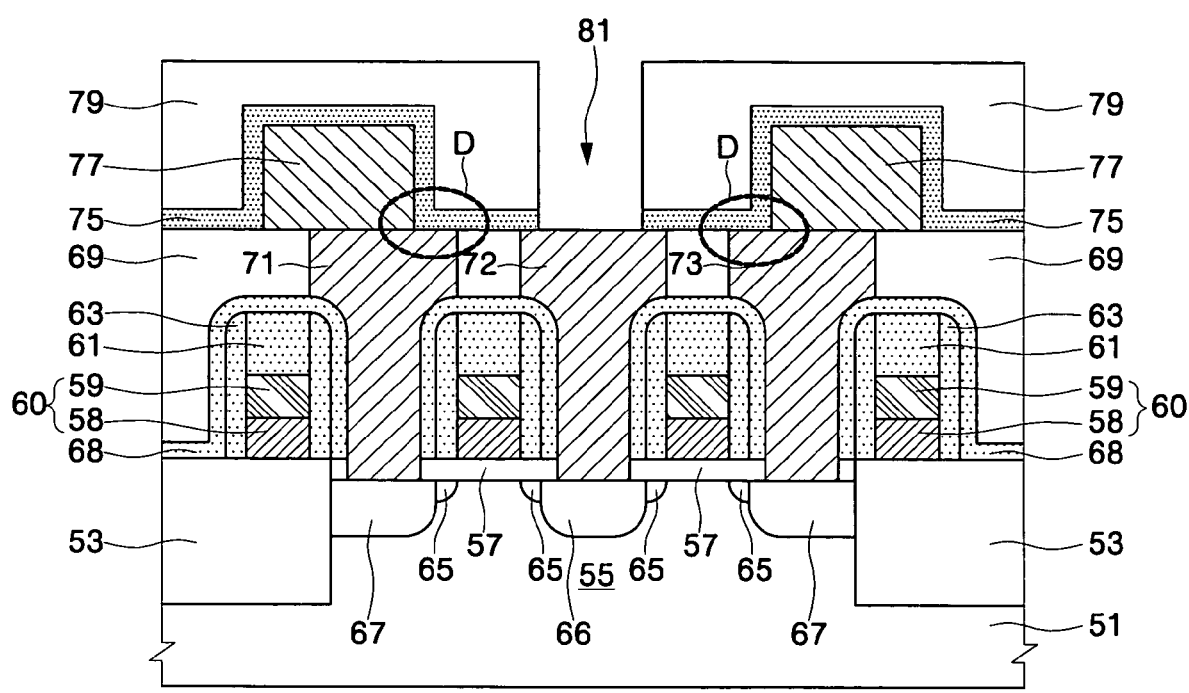

Referring to FIGS. 2 and 6, a pad extending conductive layer may be formed which contacts with the source landing pads 71 and 73 and the drain landing pad 72 and covers the first interlayer insulating 69. The pad extending conductive layer may be formed of a polysilicon layer and/or a metal layer. According to an example embodiment of the present invention, if the pad extending conductive layer is formed of the metal layer, the pad extending conductive layer may be formed of a tungsten (W) layer.

The pad extending conductive layer may be patterned to form the pad extending part 77 on at least one of the source landing pads 71 and 73 and the drain landing pad 72. The pad extending part 77 has an upper surface which is located in a plane above a plane corresponding to the upper surfaces of the source landing pads 71 and 73 and the drain landing pad 72. A process of patterning the pad extending conductive layer may include, for example, the steps of forming a photoresist pattern on the pad extending conductive layer, selectively etching the pad extending conductive layer using the photoresist pattern as an etching mask, and removing the photoresist pattern.

First, an example embodiment in which the pad extending part 77 may be arranged on and/or laminated on the source landing pads 71 and 73 will be discussed with reference to FIG. 6. The pad extending part 77 may be laminated on the source landing pads 71 and 73. The pad extending parts 77 may have the structure D, wherein the pad extending parts 77 are misaligned with the source landing pads 71 and 73 to be apart from the drain landing pad 72 such that the distance between pad extending parts 77 and the drain landing pad 72 is greater than the distance between the source landing pads 71 and 73 and the drain landing pad 72 (e.g., d4>d3). According to an example embodiment of the present invention, if the pad extending parts 77 have the structure D and/or are misaligned with the source landing pads 71 and 73, the pad extending parts 77 overlap with the upper surfaces of the source landing pads 71 and 73. According to an example embodiment of the present invention, the pad extending parts 77 overlap with the upper surfaces of the source landing pads by at least a half of a maximum contact area of the upper surfaces of the source landing pads 71 and 73.

The second etch stopping layer 75 may be formed on the semiconductor substrate 51 having the pad extending part 77. The second etch stopping layer 75 may be formed to cover the sidewalls of the pad extending parts 77 and/or the first interlayer insulating layer 69. Alternatively, the second etch stopping layer 75 may be anisotropically etched to leave the second etch stopping layer 75 only on the sidewalls of the pad extending parts 77.

The second interlayer insulating layer 79 may be formed on the semiconductor substrate 51 having the pad extending parts 77 and/or the second etch stopping layer 75. The second interlayer insulating layer 79 and/or the second etch stopping layer 75 may be patterned to form the bit line contact hole 81 exposing the drain landing pad 72. The second interlayer insulating layer 79 may be formed of a silicon oxide layer using chemical vapor deposition. According to an example embodiment of the present invention, the second etch stopping layer 75 may be formed of an insulating layer having the same etching selection ratio as the second interlayer insulating layer 79. For example, if the second interlayer insulating layer 79 is formed of the silicon oxide layer, the second etch stopping layer 75 may be formed of a silicon nitride layer using chemical vapor deposition.

Figure 7:
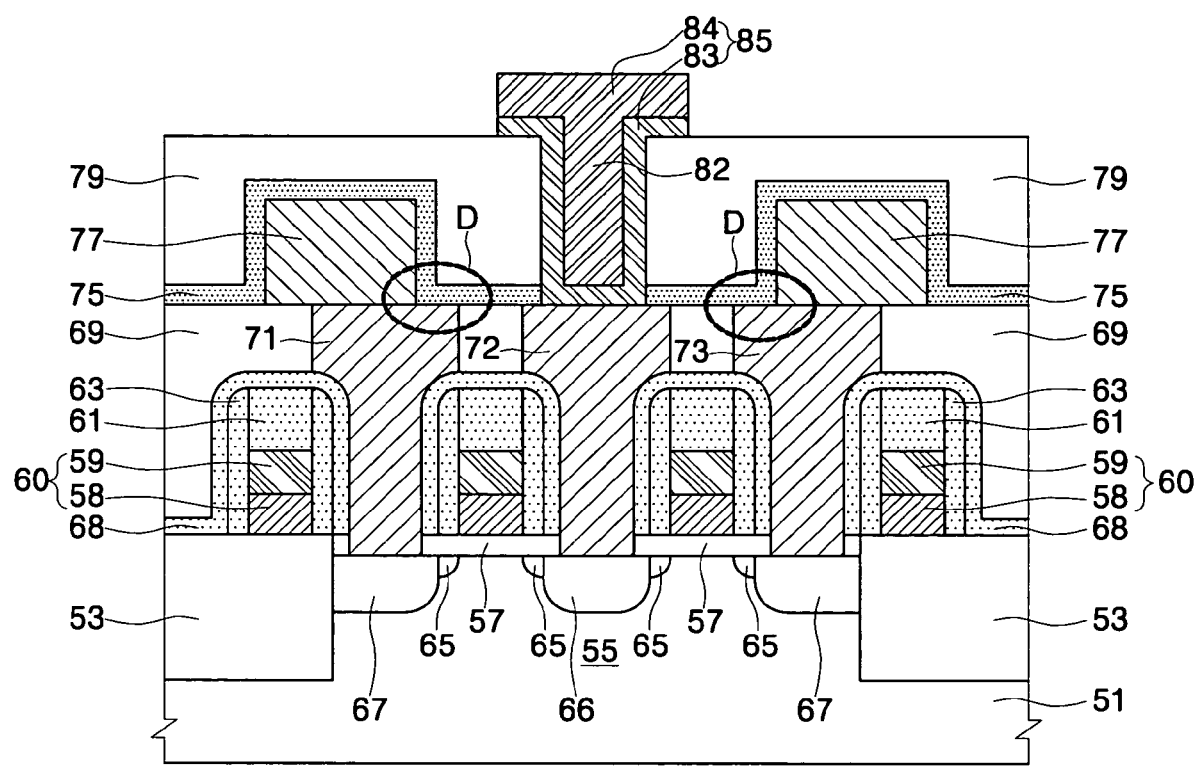

Referring to FIGS. 2 and 7, a bit line conductive layer may be formed to completely fill the bit line contact hole 81 and/or cover the second interlayer insulating layer 79. The bit line conductive layer may be patterned to form the bit line 85 on the second interlayer insulating layer 79. According to an example embodiment of the present invention, the bit line 85 may be formed of the barrier metal layer 83 and the bit line metal layer 84 laminated in sequence. The bit line metal layer and barrier metal may be formed of various metals. For example, the bit line metal layer 84 may be formed of a tungsten (W) layer and the barrier metal layer 83 may be formed of a titanium nitride (TiN) layer. The bit line contact plug 82 composed of the barrier metal layer 83 and the bit line metal layer 84 laminated in sequence may be formed in the bit line contact hole 81. Accordingly, the bit line 85 may be electrically connected to the drain region 66 through the bit line contact plug 82 and/or the drain landing pad 72.

Figure 8:
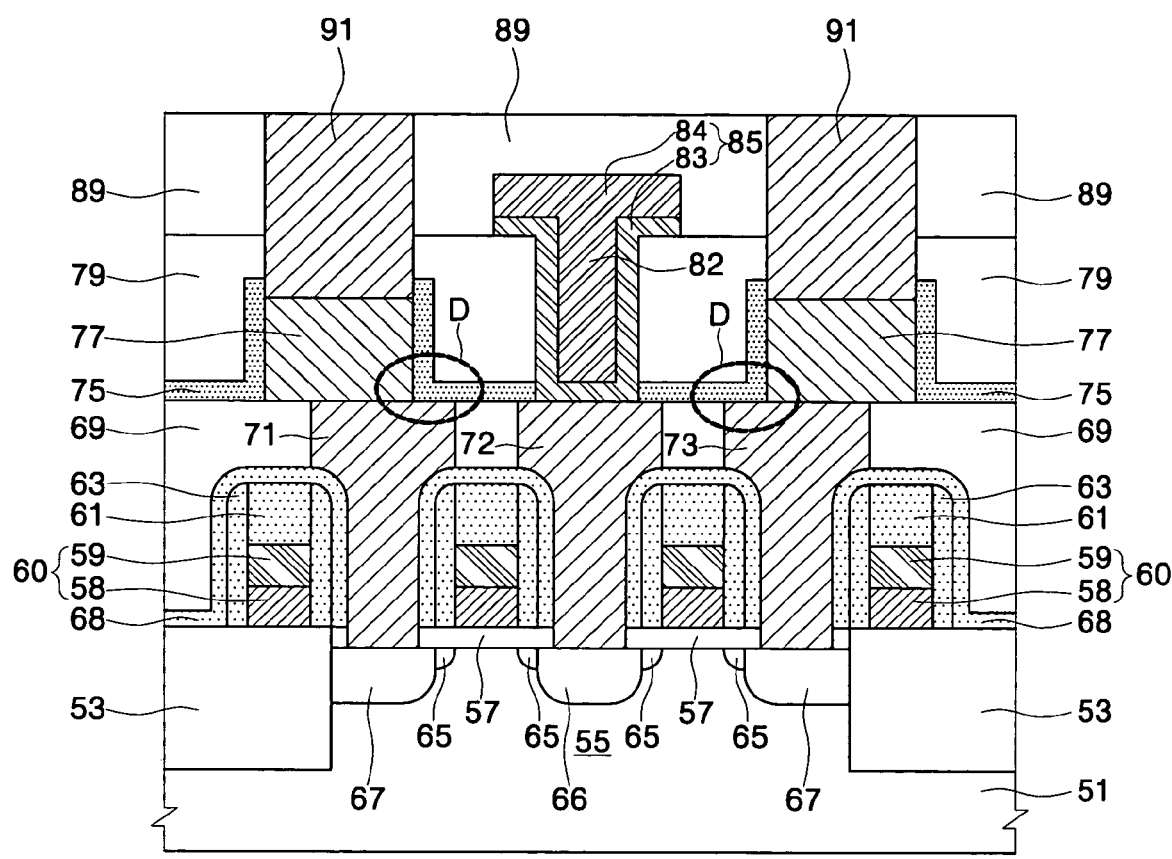

Referring to FIGS. 2 and 8, a third interlayer insulating layer 89 may be arranged on and/or laminated on the semiconductor substrate 51 having the bit line 85. The third interlayer insulating layer 89 may be formed of a silicon oxide layer. The silicon oxide layer may be formed using chemical vapor deposition. The third interlayer insulating layer 89 and the second interlayer insulating layer 79 may be successively patterned to form the storage node contact holes exposing the pad extending parts 77. The storage node contact conductive layer may be formed to completely fill the storage node contact holes and/or cover the third interlayer insulating layer 89.

According to an example embodiment of the present invention, the storage node contact conductive layer may be formed of a polysilicon layer and/or a metal layer. For example, if the storage node contact conductive layer is formed of the metal layer, the storage node contact conductive layer may be formed of a tungsten (W) layer. The storage node contact conductive layer may be planarized to form the storage node contact plugs 91. A process of planarizing the storage node contact conductive layer may use a chemical and/or mechanical polishing method using the third interlayer insulating layer 89 as a stopping layer. Accordingly, storage node contact plugs 91 may be formed which pass through the third interlayer insulating layer 89 and the second interlayer insulating layer 79 and contact with the pad extending parts 77.

According to an example embodiment of the present invention, the source landing pads 71 and 73 and drain landing pad 72 may be formed, followed by the formation of bit line 85. After the bit line 85, source landing pads 71 and 73, and drain landing pad 72 are formed, the storage node contact plugs 91 may be formed.

Hereinafter, an example embodiment of a method of fabricating the DRAM device according to an example embodiment of the present invention will be described. Referring back to FIGS. 2 and 3, the cell capacitors 97 may be formed on the semiconductor substrate 51 having the storage node contact plugs 91. The cell capacitors 97 may be formed by laminating the one or more lower electrodes 93, the capacitor dielectric layer 94, and the one or more upper electrodes 95 in sequence.

Accordingly, the storage node contact plugs 91 may be formed between the lower electrodes 93 and the pad extending parts 77. The storage node contact plugs 91 may pass through the third interlayer insulating layer 89 and the second interlayer insulating layer 79. The lower electrodes 93 of the cell capacitors 97 may electrically connect to the source regions 67 through the storage node contact plugs 91, the pad extending parts 77, and the source landing pads 71 and 73.

Figure 9:
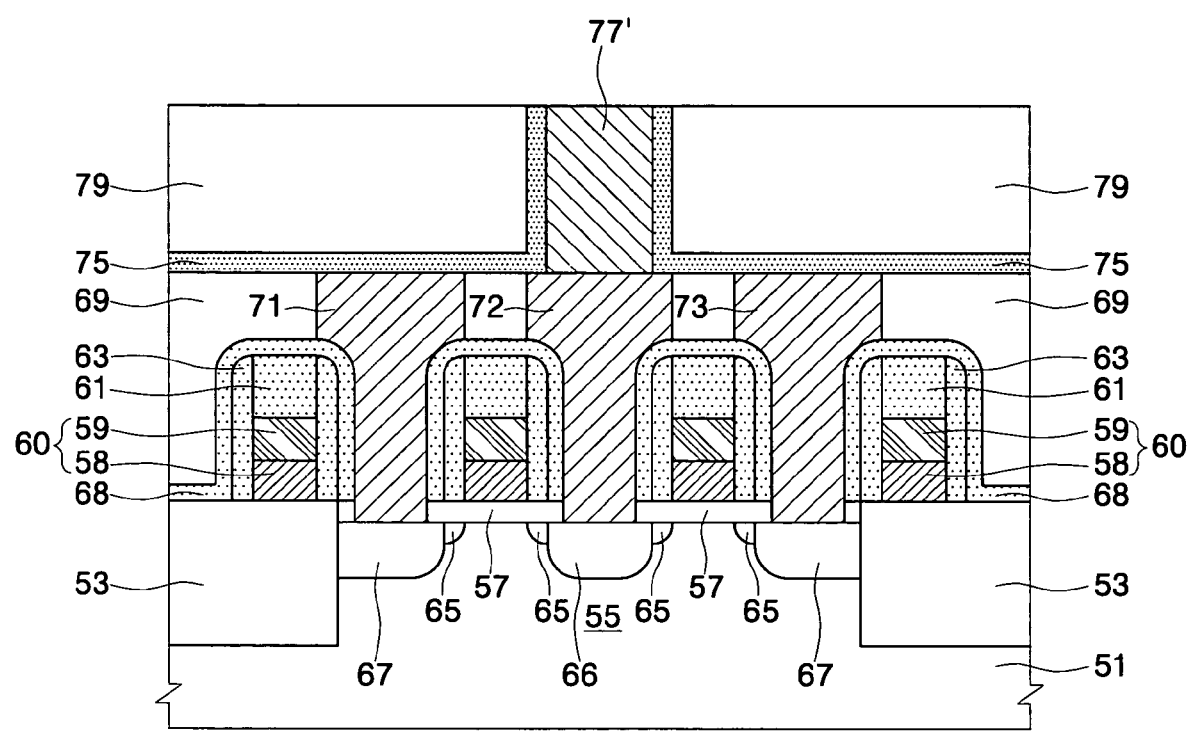
FIG. 9 is a cross-sectional view taken along the line I-I' of FIG. 2 for illustrating an example embodiment of a method of fabricating another example embodiment of a DRAM device of the present invention.

FIG. 9 is a cross-sectional view taken along the line I-I' for illustrating an example embodiment of a method of fabricating another DRAM device according to an example embodiment of the present invention. The method of fabricating the DRAM may employ a process of laminating the pad extending part 77' on the drain landing pad 72. Hereinafter, only the parts which are different from the method of fabricating the DRAM device having the pad extending part 77 will be described.

Referring to FIGS. 2 and 9, the first interlayer insulating layer 69, the source landing pads 71 and 73, and the drain landing pad 72 may be formed using the methods similar to those described with reference to FIGS. 4 and 5. The pad extending part 77' may be arranged on and/or laminated on the drain landing pad 72. A pad extending conductive layer may be formed which contacts with the source landing pads 71 and 73 and the drain landing pad 72 and covers the first interlayer insulating layer 69. The pad extending conductive layer may be formed of a polysilicon layer and/or a metal layer. According to an example embodiment of the present invention, if the pad extending conductive layer is formed of the metal layer, the pad extending conductive layer may be formed of a tungsten (W) layer. The pad extending conductive layer may be patterned to form the pad extending part 77' on the drain landing pad 72. In an example embodiment of the present invention shown in FIG. 9, the pad extending part 77' has an upper surface which is located in a plane above the upper surfaces of the source landing pads 71 and 73. The process of patterning the pad extending conductive layer may include, for example, the steps of forming a photoresist pattern on the pad extending conductive layer, selectively etching the pad extending conductive layer using the photoresist pattern as an etching mask, and removing the photoresist pattern.

A second etch stopping layer 75 may be formed on the semiconductor substrate 51 having the pad extending part 77'. The second etch stopping layer 75 may be formed to cover the sidewalls of the pad extending part 77' and the first interlayer insulating layer 69. Alternatively, the second etch stopping layer 75 may be anisotropically etched to leave the second etch stopping layer 75 only on the sidewalls of the pad extending part 77'.

The second interlayer insulating layer 79 may be formed on the semiconductor substrate 51 having the pad extending part 77' and the second etch stopping layer 75. The second interlayer insulating layer 79 may be formed, for example, by forming a silicon oxide layer on the semiconductor substrate 51 having the pad extending part 77' using chemical vapor deposition and then planarizing the silicon oxide layer. The process of planarizing the silicon oxide layer may use a chemical and/or mechanical polishing method using the pad extending part 77' as a stopping layer. As a result, the upper surface of the pad extending part 77' may be exposed. The upper surfaces of the pad extending part 77' and the second interlayer insulating layer 79 may be formed on the substantially same plane. According to an example embodiment of the present invention, the second etch stopping layer 75 may be formed of an insulating layer having the same etching selection ratio as the second interlayer insulating layer 79. For example, if the second interlayer insulating layer 79 is the silicon oxide layer, the second etch stopping layer 75 may be formed of a silicon nitride layer using chemical vapor deposition.

Referring to FIGS. 2 and 10, a bit line conductive layer may be formed on the semiconductor substrate 51 having the second interlayer insulating layer 79 and the pad extending part 77'. The bit line conductive layer may be patterned to form the bit line 85' which traverses the second interlayer insulating layer 79 and/or contacts with the pad extending part 77'. The bit line 85' may be formed of the barrier metal layer 83' and the bit line metal layer 84' laminated in sequence. For example, the bit line metal layer 84' may be formed of a tungsten (W) layer and the barrier metal layer 83' may be formed of a titanium nitride (TiN) layer. The bit line 85' may be electrically connected to the drain region 66 through the pad extending part 77' and the drain landing pad 72.

The third interlayer insulating layer 89 may be formed on the semiconductor substrate 51 having the bit line 85'. For example, the third interlayer insulating layer 89 may be formed of a silicon oxide layer using chemical vapor deposition. The third interlayer insulating layer 89 and the second interlayer insulating layer 79 may be successively patterned to form the storage node contact holes exposing the source landing pads 71 and 73. The storage node contact conductive layer may be formed to completely fill the storage node contact holes and/or cover the third interlayer insulating layer 89.

The storage node contact conductive layer may be formed of a polysilicon layer and/or a metal layer. For example, if the storage node contact conductive layer is formed of the metal layer, the storage node contact conductive layer may be a tungsten (W) layer. The storage node contact conductive layer may be planarized to form the storage node contact plugs 91'. The process of planarizing the storage node contact conductive layer may use a chemical and/or mechanical polishing method using the third interlayer insulating layer 89 as a stopping layer. As a result, the storage node contact plugs 91' may be formed, which pass through the third interlayer insulating layer 89 and the second interlayer insulating layer 79 and contact with the source landing pads 71 and 73.

The storage node contact plugs 91' may have structure wherein the storage node contact plugs 91' are misaligned with the source landing pads 71 and 73 to be apart from the drain landing pad 72, such that the distance between the contact plugs 91' and the drain landing pad 72 is greater than the distance between the source landing pads 71 and 73 and the drain landing pad 72 (e.g., d6>d5). According to an example embodiment of the present invention, if the storage node contact plugs 91' have the structure D that they are misaligned with the source landing pads 71 and 73, it is preferable that the storage node contact plugs 91' overlap with the upper surfaces of the source landing pads 71 and 73. According to an example embodiment of the present invention shown in FIG. 10, the storage node contact plugs 91' overlap with the upper surfaces of the source landing pads 71 and 73 by at least half of the maximum contact area of the upper surfaces of the source landing pads 71 and 73. A DRAM device according to an example embodiment of the present invention can be fabricated using the methods similar to those described with reference to FIG. 3.

According to an example embodiment of the present invention, the first interlayer insulating layer, the source landing pads, and the drain landing pad may be provided on the semiconductor substrate having cell transistors. The upper surfaces of the first interlayer insulating layer, the source landing pads, and the drain landing pad may be arranged on a substantially same plane. The pad extending part may be arranged on and/or laminated on at least one of the source landing pads and the drain landing pad. The pad extending part has an upper surface which is located in a plane above a plane corresponding to the upper surfaces of the source landing pads and the drain landing pad. Further, example embodiments of the present invention may include pad extending parts that are misaligned with the source landing pads to be apart from the drain landing pad such that the distance between pad extending parts 77 and the drain landing pad 72 is greater than the distance between the source landing pads 71 and 73 and the drain landing pad 72 (e.g., d4>d5). The contact plug such as the storage node contact plug may be arranged on the source landing pads. Accordingly, the alignment margin of the contact plug may be remarkably increased. As such, a highly integrated semiconductor device can be realized.

The present invention is not limited to the above-mentioned embodiments and one skilled in the art will recognize that various aspects of the example embodiments of the present invention may be changed and still fall within the scope of the present invention. For example, the teachings of the example embodiments of the present invention may be applied to a nonvolatile memory device having transistors and a method of fabricating the same.

Further, example embodiments of the present invention describe the use chemical vapor deposition (CVD) to form certain layers (e.g., first etch stopping layer 68, second interlayer insulating layer 79, etc.), however, one skilled in the art would recognize that the layers could be formed using a variety of other techniques including, but not limited to, physical vapor deposition (PVD), plasma enhanced chemical vapor deposition (PECVD), laser-induced chemical vapor deposition (LVCD) etc.

Still further, the detailed description of example embodiments of the present invention, describe techniques such as anisotropic etching, chemical mechanical polishing, etc., however, one skilled in the art would recognize that various etching and polishing techniques may be used as substitutes for these techniques.

What is claimed is:

1. A semiconductor device comprising:
an isolation layer provided in an area of a semiconductor substrate and defining an active region;
a gate electrode traversing the active region;
a source region provided in the active region at one side of the gate electrode;
a drain region provided in the active region at a second side of the gate electrode;
a first interlayer insulating layer covering the semiconductor substrate having the gate electrode;
a source landing pad, which passes through the first interlayer insulating layer, that is provided on and electrically connected to the source region;
a drain landing pad, which passes through the first interlayer insulating layer, that is provided on and electrically connected to the drain region; and
a pad extending part laminated on at least one of the source landing pad and the drain landing pad and having an upper surface which is located above upper surfaces of the source landing pad and the drain landing pad, wherein
the pad extending part is laminated on the source landing pad, the pad extending part is misaligned with the source landing pad and wherein the pad extending part overlaps with the upper surface of the source landing pad by at least a half of a maximum contact area of the source landing pad, wherein a distance between the pad extending part and the drain landing pad is greater than a distance between the source landing pad and the drain landing pad.

2. The device according to claim 1, further comprising:

an insulating spacer arranged on a sidewall of the gate electrode; and a first etch stopping layer, which covers the semiconductor substrate having the gate electrode, that is provided below the first interlayer insulating layer.

3. The device according to claim 1, wherein the upper surfaces of the first interlayer insulating layer, the source landing pad, and the drain landing pad are arranged on a substantially same plane.

4. The device according to claim 1, further comprising:

a bit line which is arranged on and electrically connected to the drain landing pad; and a cell capacitor arranged on the source landing pad, wherein a lower electrode of the cell capacitor is electrically connected to the source landing pad.

5. A semiconductor device comprising:

an isolation layer provided in an area of a semiconductor substrate and defining an active region;

a gate electrode traversing the active region;

a source region provided in the active region at one side of the sate electrode;

a drain region provided in the active region at a second side of the gate electrode;

a first interlayer insulating layer covering the semiconductor substrate having the sate electrode;

a source landing pad, which passes through the first interlayer insulating layer, that is provided on and electrically connected to the source region;

a drain landing pad, which passes through the first interlayer insulating layer, that is provided on and electrically connected to the drain region; and a pad extending part laminated on at least one of the source landing pad and the drain landing pad and having an upper surface which is located above upper surfaces of the source landing pad and the drain landing pad, wherein the pad extending part is laminated on the source landing pad, the pad extending part is misaligned with the source landing pad, a second interlayer insulating layer covering the first interlayer insulating layer;

a bit line contact plug which passes through the second interlayer insulating layer and contacts with the drain landing pad;

a bit line which is arranged on the second interlayer insulating layer and contacts the bit line contact plug;

a third interlayer insulating layer covering the bit line and the second interlayer insulating layer; and a storage node contact plug which passes through the third interlayer insulating layer and the second interlayer insulating layer and contacts with the pad extending part.

6. The device according to claim 5, further comprising a second etch stopping layer interposed between a sidewall of the pad extending part and the second interlayer insulating layer.

7. A semiconductor device comprising:

an isolation layer provided in an area of a semiconductor substrate and defining an active region;

a gate electrode traversing the active region;

a source region provided in the active region at one side of the gate electrode;

a drain region provided in the active region at a second side of the gate electrode;

a first interlayer insulating layer covering the semiconductor substrate having the gate electrode;

a source landing pad, which passes through the first interlayer insulating layer, that is provided on and electrically connected to the source region;

a drain landing pad, which passes through the first interlayer insulating layer, that is provided on and electrically connected to the drain region;

a pad extending part laminated on at least one of the source landing pad and the drain landing pad and having an upper surface which is located above upper surfaces of the source landing pad and the drain landing pad;

a storage node contact plug contacting the source landing pad, wherein the pad extending part is laminated on the drain landing pad, and the storage node contact plug is misaligned with the source landing pad;

a second interlayer insulating layer covering the first interlayer insulating layer and exposing the upper surface of the pad extending part;

a bit line which is arranged on the second interlayer insulating layer and contacts the pad extending part; and a third interlayer insulating layer covering the bit line and the second interlayer insulating layer, wherein the storage node contact plug passes through the third interlayer insulating layer and the second interlayer insulating layer, wherein the storage node contact plug overlaps with the upper surface of the source landing pad by at least a half of a maximum contact area of the source landing pad, wherein a distance between the storage node contact plug and the drain landing pad is greater than a distance between the source landing pad and the drain landing pad.

8. The device according to claim 7, further comprising a second etch stopping layer which is provided below the second interlayer insulating layer and covers a sidewall of the pad extending part and the first interlayer insulating layer.

9. The device according to claim 7, further comprising a second etch stopping layer interposed between a sidewall of the pad extending part and the second interlayer insulating layer.

* * * * *